United States Patent [19]
Nomura et al.

[11] Patent Number: 4,828,392
[45] Date of Patent: May 9, 1989

[54] EXPOSURE APPARATUS

[75] Inventors: Noboru Nomura, Kyoto; Kazuhiro Yamashita, Amagasaki; Takayoshi Matsumura, Neyagawa; Midori Yamaguchi, Ibaraki, all of Japan

[73] Assignee: Matsushita Electric Industrial Co., Ltd., Kadoma, Japan

[21] Appl. No.: 837,766

[22] Filed: Mar. 10, 1986

[30] Foreign Application Priority Data

Mar. 13, 1985 [JP] Japan .................. 60-50001
Apr. 1, 1985 [JP] Japan .................. 60-68721
May 20, 1985 [JP] Japan .................. 60-107370

[51] Int. Cl.$^4$ .............................. G01B 9/02
[52] U.S. Cl. .................. 356/401; 356/356; 356/363
[58] Field of Search ........... 356/400, 403, 356, 363, 356/401; 250/557

[56] References Cited

U.S. PATENT DOCUMENTS

| | | | |
|---|---|---|---|
| 3,796,497 | 3/1974 | Mathisen et al. | 356/400 |
| 3,836,257 | 9/1974 | Matsumoto | 356/356 |
| 4,251,129 | 2/1981 | Suzki et al. | 356/401 |
| 4,371,264 | 2/1983 | Lacombat et al. | 356/356 |
| 4,423,959 | 1/1984 | Nakazawa et al. | 356/363 |
| 4,566,795 | 1/1986 | Matsura et al. | 356/401 |
| 4,631,416 | 12/1986 | Trutna | 356/400 |
| 4,636,077 | 1/1987 | Nomura et al. | 356/400 |
| 4,636,626 | 1/1987 | Hazama et al. | 250/201 |
| 4,668,089 | 5/1987 | Oshida et al. | 356/152 |

FOREIGN PATENT DOCUMENTS

DT2651430 12/1977 Fed. Rep. of Germany .
2825501 11/1979 Fed. Rep. of Germany ...... 356/356

Primary Examiner—Richard A. Rosenberger
Attorney, Agent, or Firm—Wenderoth, Lind & Ponack

[57] ABSTRACT

A reduction projection type alignment and exposure apparatus which comprises a light source, a reticle having a first grating, first lens system, a spatial filter disposed around a Fourier spectral plane of the first lens system, second lens system, a substrate having a second grating, and a plurality of photo-detectors for detecting light intensities of a plurality of spectrums appearing on the spatial filter.

The light beam generated from the light source is applied to the reticle at which it is divided into a plurality of diffracted light beams by the first grating, and the diffracted light beams are applied through the first lens system, the spatial filter and the second lens system onto the substrate so that the diffracted light beams are re-diffracted by the second grating, and the re-diffracted light beams appear as a plurality of spectrums on the spatial filter. These spectrums are detected by photo-detectors and used for alignment of the reticle and the substrate.

15 Claims, 10 Drawing Sheets

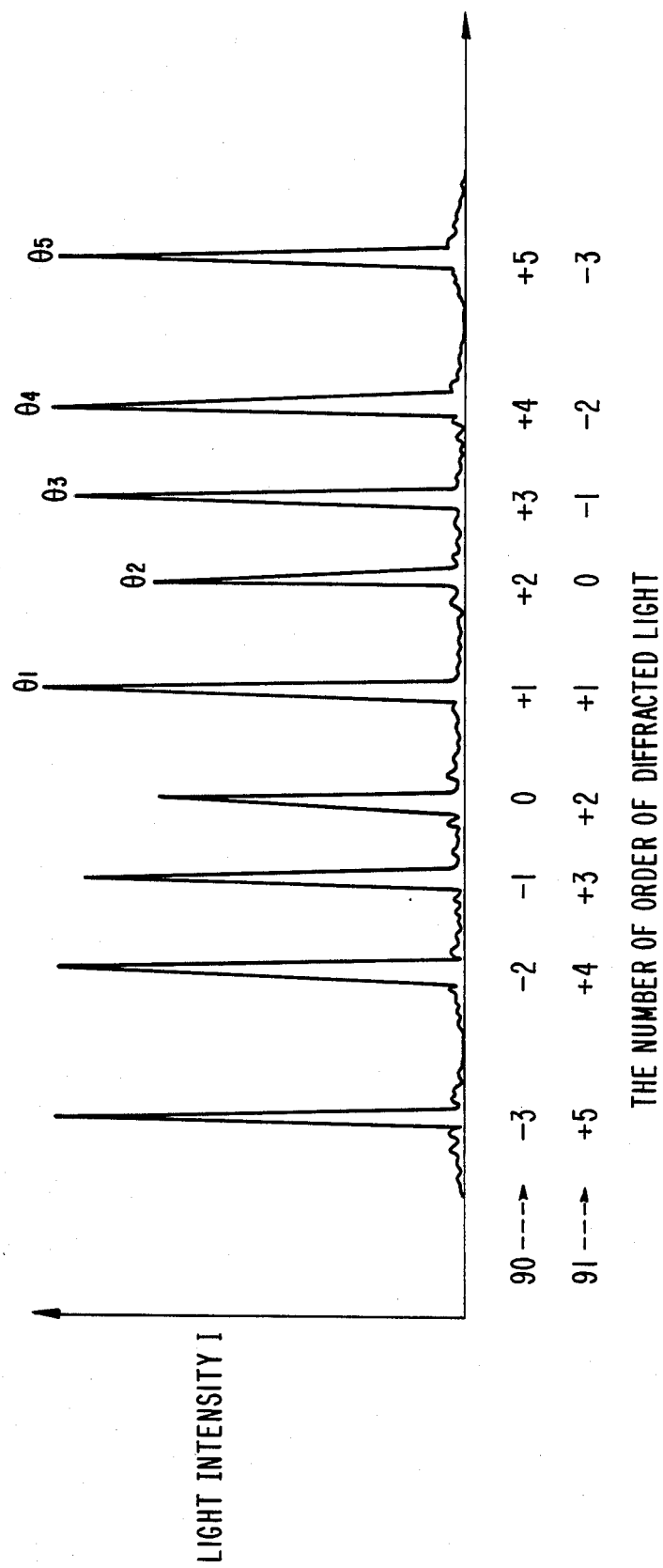

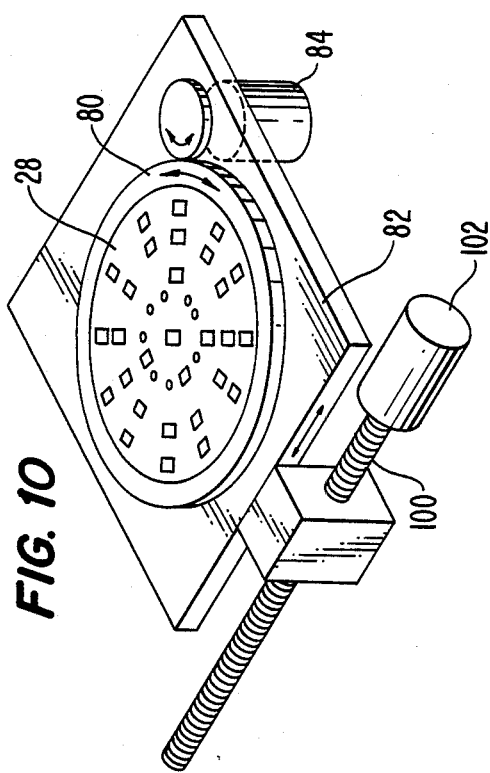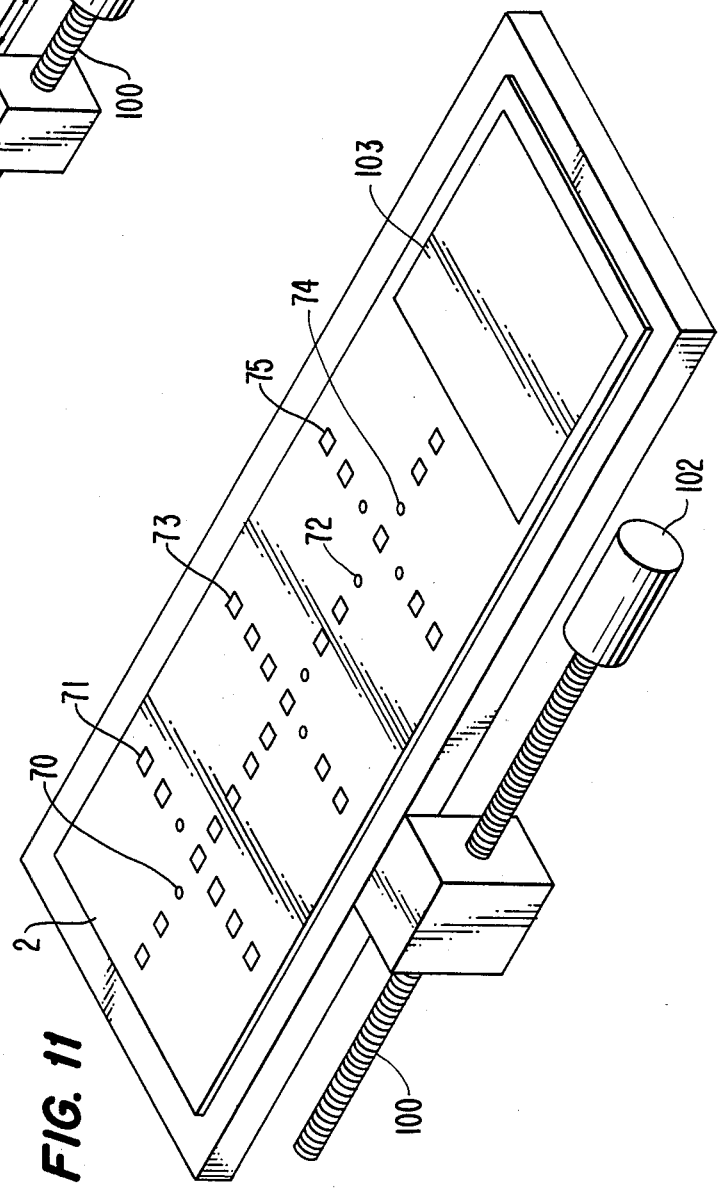

EXPOSURE APPARATUS

This invention relates to an exposure apparatus which is capable of realizing a line width of submicron order and high precision alignment of a reticle and a wafer.

The rate of integration in semiconductor devices has been increasing more and more recently, and therefore, dimensions of semiconductor devices are approaching values which are submicron in order. In forming minute patterns which are submicron in order, it is not possible to use conventional exposure with ultra violet rays to form such minute patterns. Exposure apparatus which may realize forming of such minute patterns include exposure apparatus which use deep ultra violet rays, X rays, an electron beam, an ion beam, etc. However, such exposure apparatus are expensive and, in exposure apparatus which use X rays, an electron beam, or an ion beam, the beam strength is weak and exposure takes a long time which makes it difficult to apply such exposure apparatus to mass production of semiconductor devices.

An exposure apparatus which has been used for mass production of semiconductor devices includes a reduction projection alignment and exposure apparatus, i.e., reduction projection aligner. The exposure apparatus of this type comprises a light source, a condenser lens, a reticle and a reduction microlens. A beam of light from the light source is applied to the reduction microlens through the condenser lens and the reticle. An image of a reticle pattern is focused on a wafer by the reduction microlens. In the case of the above-stated reduction projection exposure, a numerical aperture N.A. can be set to a large number, and, supposing that N.A. is 0.32, a reduction rate m is 10 and a wave length λ of the light beam is 435.6 nm, the highest resolution (minimum feature size) being approximately 0.9 μm in line width.

In realizing semiconductor devices with a submicron order line width alignment of a photo-mask and the wafer is important. In the past, several alignment methods have been used or proposed. One such method is the mark alignment method wherein an alignment mark is disposed on the photo-mask and the wafer, respectively. The alignment is carried out by aligning the two alignment marks. This method provides low alignment precision of 0.2 μ/3σ, and therefore, can not be applied to production of submicron devices.

Another method is the superimposed dual grating interferometric alignment method which was proposed by S. Austin (See, Applied Physics Letters, Vol. 31, No. 7, P. 428, 1977). This method uses interference of light rays and can realize a high precision alignment of the photo-mask and the waver, but the constructed interferometers were not ideal so that the alignment was affected by the gap between the mask and the wafer. As a result, it is difficult to make a commercially usable apparatus.

Still another method is the alignment method in which secondary electron emission emitted from semiconductor devices is observed. However, this method can not be used in air so that output in manufacturing LSIs is small.

Incidentally, the subject matter of the present invention is related to commonly owned U.S. patent application Ser. No. 761,024, filed on July 31, 1985 by the same inventors.

SUMMARY OF THE INVENTION

It is, accordingly, a primary object of this invention to provide an exposure apparatus which is capable of eliminating the above-stated drawbacks of the conventional apparatus.

Another object of this invention is to provide an exposure apparatus which is capable of realizing a line width which is submicron in order at low cost utilizing a device having a simple structure.

A further object of this invention is to provide an exposure apparatus which is capable of realizing precise alignment of minute patterns in air utilizing a device having a simple structure.

These and other objects are accomplished with an exposure apparatus which comprises a light source; a reticle having at least a first grating, a first lens system; a spatial filter disposed around a Fourier spectral plane of the first lens system; a second lens system; a substrate having at least a second grating; and a plurality of photo-detectors for detecting light intensity of a plurality of spectrums appearing on the spatial filter. The light beam generated from the light source is applied to the reticle at which it is divided into a plurality of diffracted light beams by the first grating, and the diffracted light beams are applied through the first lens system, the spatial filter and the second lens system onto the substrate so that the diffracted light beams are re-diffracted by the second grating, and the re-diffracted light beams appear as a plurality of spectrums on the spatial filter.

In a specific embodiments, the exposure apparatus further comprises means for processing a plurality of outputs of the photo-detectors so that the configuration of the first and second gratings is simulated thereby and the position of the reticle and substrate are aligned.

The plurality of photo-detectors may be disposed on the spatial filter. The exposure apparatus may include at least one mirror for reflecting a plurality of spectrums appearing on the spatial filter. The reflected spectrums are detected by the plurality of photo-detectors.

The spatial filter may include first openings through which pass only one of a −1st order and a +1st order diffracted light beam from among diffracted light beams diffracted by the first grating, first photo-detectors which detect light intensity of a light beam that the second grating produces by diffracting the diffracted light beam passing through the first openings, second openings through which pass only one of a +1st order and a −1st order diffracted light beam, and second photo-detectors which detect light intensity of a light beam that the second grating produces by diffracting the diffracted light beam passing through the second openings.

The first and second openings may be disposed concentrically, or may be disposed in a straight line.

The spatial filter may include first openings through which pass only one of the −1st order and +1st order diffracted light beams from among diffracted light beams diffracted by the first grating, first photo-detectors which detect light intensity of a light beam that the second grating produces by diffracting the diffracted light beam passing through the first openings, second openings through which ±1st order diffracted light beams pass, and second photo-detectors which detect light intensity of light beams that the second grating produces by diffracting the diffracted light beams passing through the second openings. In this case, the exposure apparatus may further comprise means for moving the spatial filter in such a manner that the openings are positioned to pass respective diffracted light beams.

This invention also relates to an exposure apparatus which comprises a light source, a reticle having at least a first grating, a first lens systems, a spatial filter disposed around a Fourier spectral planes of the first lens system, a second lens system, a substrate having at least second and third gratings and a plurality of photodetectors disposed in proximity of the spatial filter for detecting light intensity of diffracted light beams diffacted by the second and third gratings. The light beam generated from the light source is applied to the reticle at which it is divided into a plurality of diffrracted light beams by the first grating, and the diffracted light beams are applied through the first lens system, the spatial filter and the second lens system onto the substrate so that the diffracted light beams are re-diffracted by the second and third gratings, and light intensities of the re-diffracted light beams are detected by the photodetectors.

In a specific embodiments, the reticle may have at least two gratings comprising the at least one first grating, the two gratings being disposed separately from each other and corresponding to the second and third gratings.

This invention provides advantages, among which are as follows:

(1) The invention makes it possible to provide an exposure apparatus which may realize line width which is submicron in order at low cost with a simple structure.

(2) The invention makes it possible to provide an exposure apparatus which may realize precise alignment of minute patterns in air with a simple structure.

While the novel features of the invention are set forth with particularity in the appended claims, the invention, both as to its organization and content, will be better understood and appreciated, along with other objects and features thereof, from the following detailed description taken in conjunction with the drawings.

BRIEF DESCRIPTION OF THE DRAWINGS

FIG. 6 shows a graph of light intensity I vs. observing angle $\theta$;

FIG. 10 is a schematic perspective view of the mechanism for moving the spatial filter;

FIG. 11 is a schematic perspective view of another example of the mechanism for moving the spatial filter;

DETAILED DESCRIPTION OF THE INVENTION

Figure 1:
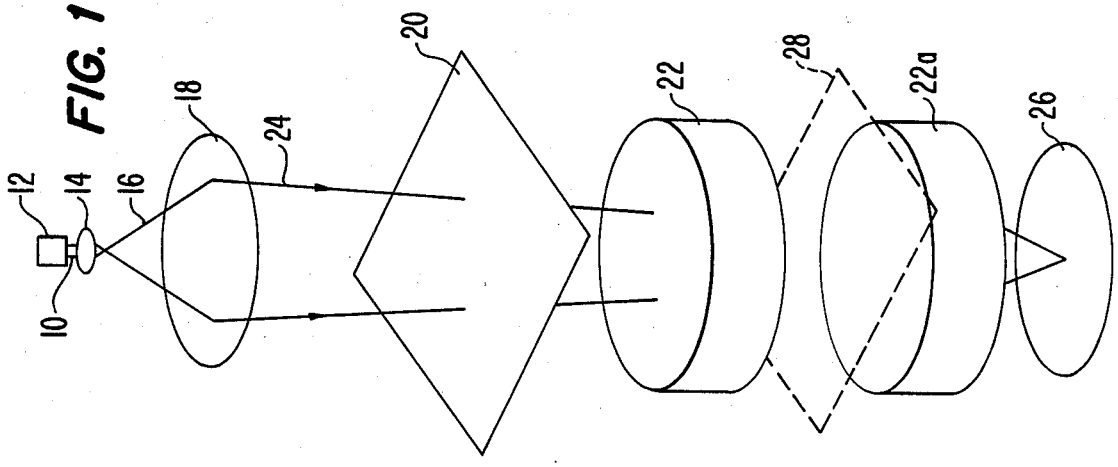
FIG. 1 shows a schematic structure of a reduction projection type light exposure apparatus as an embodiment of this invention.

FIG. 1 shows a schematic representation of a structure of a reduction projection type alignment and exposure apparatus, i.e., a reduction projection aligner, as an embodiment of this invention. A light beam 10 emitted from a light source 12 is expanded by a beam expander 14. The light source 12 is, in this embodiment, a laser device to obtain high coherency, but alternatively a whie light source such as a mercury lamp may be used since the entire optical system is a white color optical system. Expanded light 16 is applied through an optical system 18 and a reticle 20 to the incident pupil of a first Fourier transformation lens 22. The optical system 18 comprises a collimator lens or condenser lens for converting light 16 to collimated light or convergent light. The reticle 20 is located between the optical system 18 and the first Fourier transformation lens 22. Light 24 emitted from the optical system 18 passes through a pattern on the reticle 20 and then, is collected by the first Fourier lens 22. Thereafter, an image of the reticle pattern is projected through a second Fourier transformation lens 22a on a semiconductor wafer 26. In the case where a focal distance of the first Fourier transformation lens 22 is the same as that of the second Fourier transformation lens 22a, the reticle pattern is projected on the wafer 26 in the same dimension. In contrast, in the case where the focal distances of the first and second Fourier transformation lenses are varied, a reduced projection can be realized. Furthermore, if a reduction projection lens is applied between the second Fourier transformation lens 22a and the wafer 26, a reduced projection can be realized. On a rear focal plane of the first Fourier transformation lens 22, a high order diffracted light of the reticle pattern is spatially distributed. In this embodiment, a spatial filter 28 is located on the focal plane to process an image of the pattern formed in the reticle 20 and to select the spectrums of a first grating on the reticle. Thereby, a more minute pattern is projected by a reduction projection of the selected beams. The wafer 26 is supported on a stage (not shown). A second grating is provided on the wafer which re-diffracts these incident selected beams. Then, the re-diffracted beams go back through the reduction lens and the second Fourier transformation lenses. At the Fourier spectral plane the re-diffracted beams are divided into spectrums. A plurality of the light intensities of the spectrums are observed and the results are used to adjust the displacement between the reticle patterns and the wafer patterns so that they overlie each other. A detailed explanation of this process is as follows.

Figure 2:
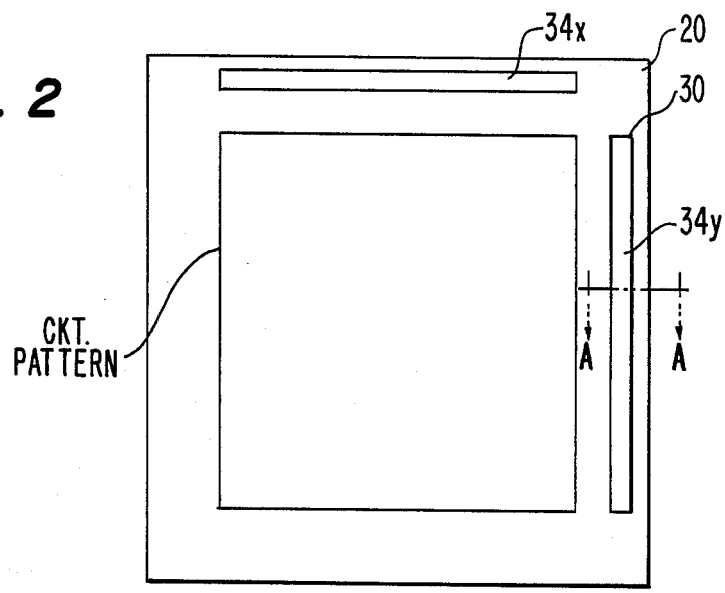
FIG. 2 is a plan view of a reticle which is used in the exposure apparatus of FIG. 1.
Figure 3:
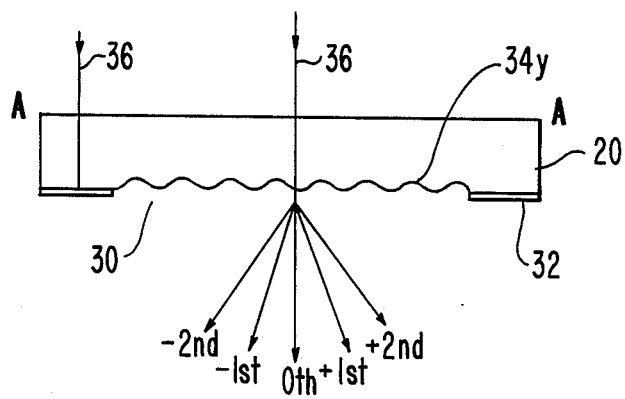
FIG. 3 is a sectional view taken along the line A—A of FIG. 2.

FIG. 2 is a plan view of the reticle 20. The reticle 20 comprises a window portion 30 through which light passes, and an interception portion 32 which intercepts light. A phase grating 34Y is formed in window 30 as shown in FIG. 3. The pattern of the window portion 30 is formed in the direction of the phase grating. A plurality of diffracted light rays such as 0 order, ±1st order, +2nd order..., etc. are diffracted by the phase grating 34. The interception portion 32 surrounding the window portion 30 is formed by a film of chromium, chromium oxide, etc. Incident light 36 passes only through the window portion 30. The phase grating 34 may be replaced by an amplitude grating, and also by an echelet grating in the case where incident light is applied obliquely.

Figure 4:
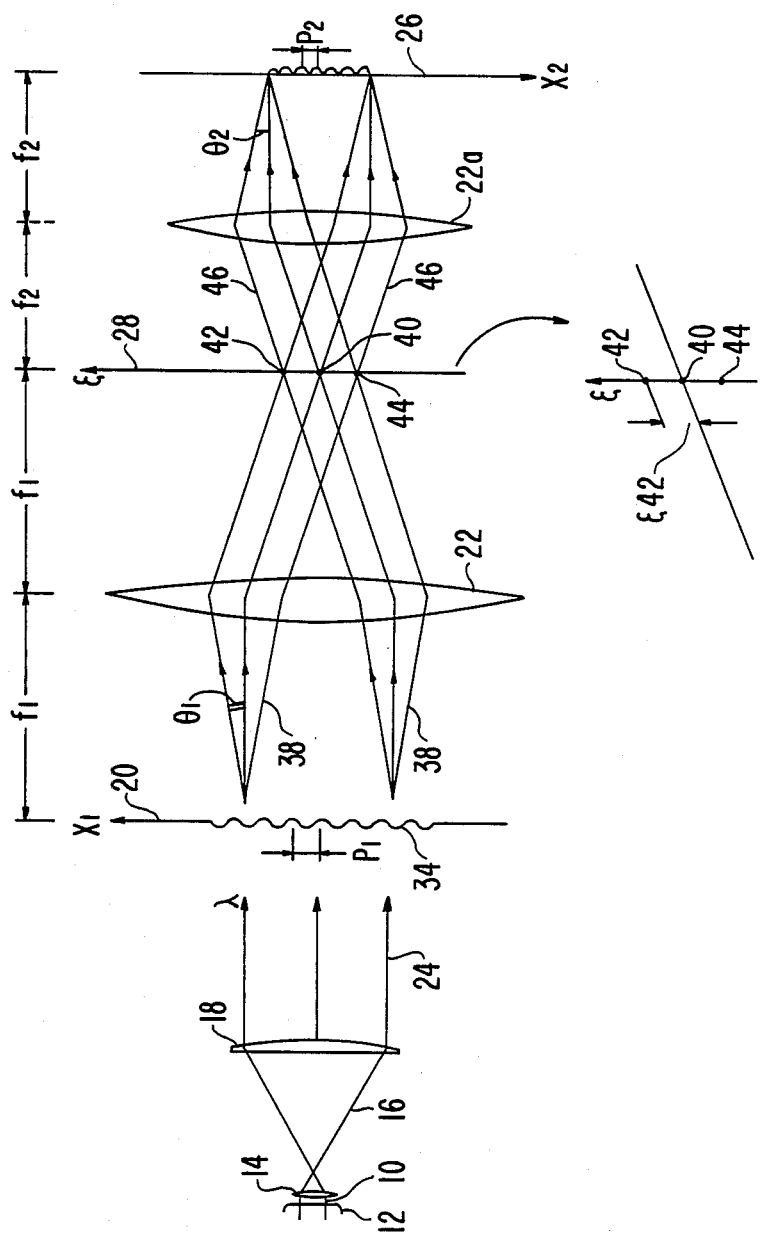

FIG. 4 is an illustration for explaining the principle of operation of the exposure apparatus of the embodiment. As stated above, the light of wave length from the light source 12 is expanded by the beam expander 14, and further, is collimated by collimator lens 18. The phase grating 34 of the reticle 20 is located at a position $X_1$ which corresponds to a front focal distance $f_1$ of the first Fourier transformation lens 22. A pitch $P_1$ of the phase grating 34 and a diffraction angle $\theta_1$ of a diffracted light beam 38 have the following relation.

$$P_1 \sin \theta_1 = \lambda \tag{1}$$

The diffracted light beam 38 is applied to the first Fourier transformation lens 22 and then, Fourier spectral images 40, 42, 44 are formed on a rear focal plane $\xi$.

The co-ordinates $\xi_{42}$ on which the Fourier spectral image 42 of first order diffracted light is shown by the following equation.

$$\xi_2 = f_1 \sin \theta_1 \tag{2}$$

The co-ordinates $\xi_{40}$ on which Fourier spectral image 40 of 0th order diffracted light is shown by the following equation. $\xi_{40} = f_1 \sin \theta_0 = 0$ (3)

Therefore, Fourier spectral image 42 is formed completely separate from the Fourier spectral image 40. As shown in FIG. 1, the spatial filter 28 is disposed on the Fourier transformation plane and prevents the passage of the 0th order diffracted light; i.e., only +1st order diffracted light is passed through the spatial filter 28. The diffracted light 46 passed through the spatial filter 28 then, passes through the second Fourier transformation lens 22a, and is projected on the wafer 26. The image formed on the wafer 26 includes an image corresponding to the reticle pattern and a fringe formed by interference of two light beams. The fringe has a pitch P which is shown as follows.

$$P_2 = \frac{\lambda}{2 \sin \theta_2} \tag{4}$$

wherein, $\theta_2$ is a diffraction angle of light which passed through the second Fourier transformation lens 22a.

Since the Fourier transformation plane of the first Fourier transformation lens 22 is located at a front focal distance $f_2$ from the second Fourier transformation lens 22a, the following relation is established.

$$f_1 \sin \theta_1 = f_2 \sin \theta_2 = \xi_{42} \tag{5}$$

The images through the first and second Fourier transformation lenses have the following relation.

$$P_2 = \frac{\lambda}{2 \sin \theta_2} = \frac{f_2 \lambda}{2 f_1 \sin \theta_1} = \frac{f_2}{f_1} \cdot \frac{P_1}{2} \tag{6}$$

As apparent from equation (6), the pitch $P_2$ of the fringe which is formed on the wafer 26 becomes half of the pitch $P_1$ of the grating 34 which is formed on the reticle 20 when $f_1$ is set to be equal to $f_2$.

Figure 5:
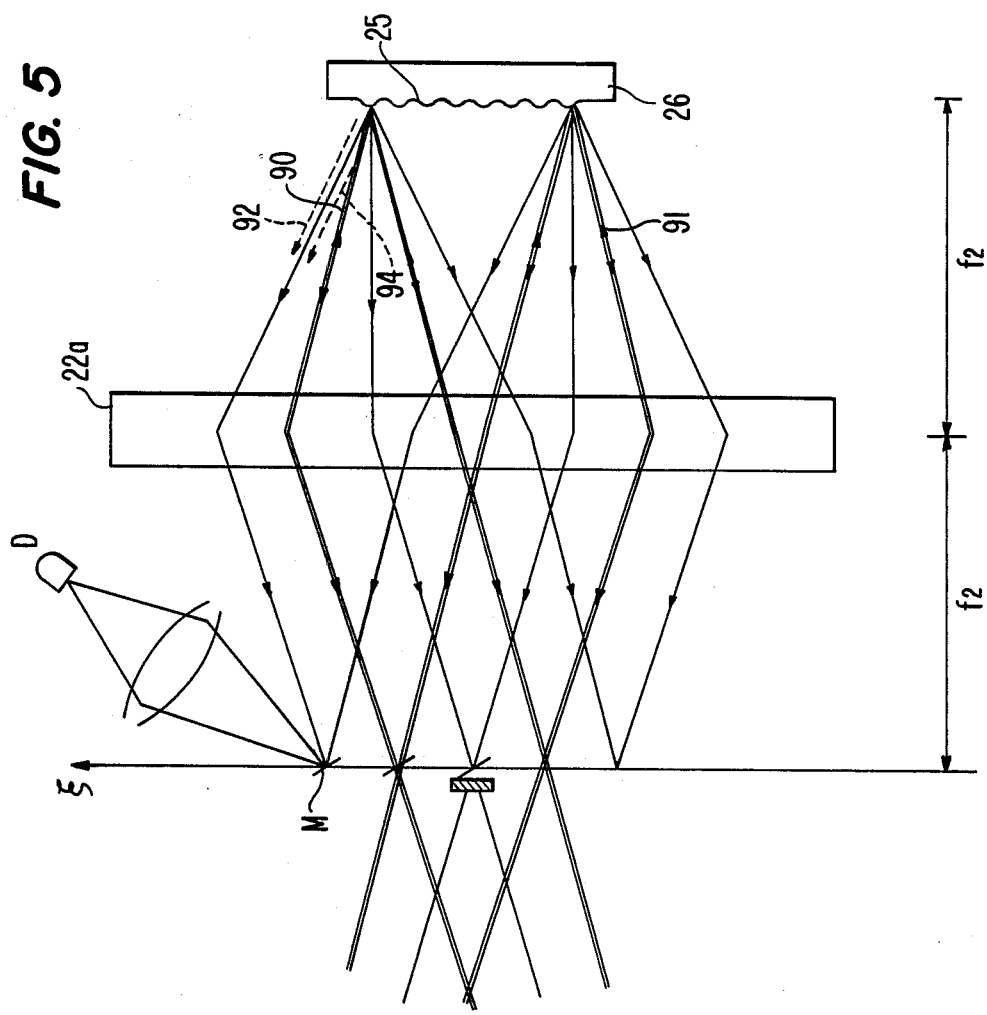
FIGS. 4 and 5 are illustrations for explaining the principle of operation of the exposure apparatus of FIG. 1.

The wafer 26 includes a grating 25 having a pitch of an integer times the fringe pitch diffracts conjugate incident beams in the same direction 92, 94 shown in FIG. 5. If these two diffracted light beams 92 and 94 are superimposed, light intensity information is obtained which indicates the relation between the fringe and the grating. The light 92 is applied through lens $L_1$ to a photo-detector D. Optical intensity I which is observed by the photo-detector D is shown as follows.

$$I = U_A{}^2 + U_B{}^2 + U_A{}^* \cdot U_B + U_A \cdot U_B{}^* \tag{7}$$

wherein, $U_A$, $U_B$ represent the amplitude of incident light beams 90, 91, respectively, and $U_A{}^*$, $U_B{}^*$ represent the conjugate complex amplitude thereof.

$$U_A{}^2 = A^2 \left( \frac{\sin N \frac{\delta A}{2}}{\sin \frac{\delta A}{2}} \right)^2 \tag{8}$$

$$U_B{}^2 = B^2 \left( \frac{\sin N \frac{\delta B}{2}}{\sin \frac{\delta B}{2}} \right)^2 \tag{9}$$

$$U_A{}^* \cdot U_B + U_A \cdot U_B{}^* = 2 \cdot A \cdot \tag{10}$$

$$B \cos \left[ (N-1) \frac{\delta A - \delta B}{2} + KX (\sin \theta_A - \sin \theta_B) \right] \times$$

$$\frac{\sin N \frac{\delta A}{2} \cdot \sin N \frac{\delta B}{2}}{\sin \frac{\delta A}{2} \cdot \sin \frac{\delta B}{2}}$$

Wherein, A, B are constants, N is the number of the grating, $\delta A$, $\delta B$ are the phase retardations between the diffracted light beams diffracted by two adjacent gratings, X is the relative position between the fringe formed by the light beams 90, 91, and the grating $\delta A$, $\delta B$: are angles formed by light beams 90, 91, and a line perpendicular to the wafer 26.

FIG. 6 shows a graph of light intensity I vs. Observing Angle characteristic $\theta$ under the condition that the pitch of the fringe is 1 $\mu$m and the pitch of the grating is 2 $\mu$m. A spark peak of light intensity appears only when the pitch of the grating is an integer times the pitch of the fringe. In FIG. 6, the observing angle varies from $-\pi/2$ through $\pi/2$ and five peaks appear at $\theta_1$, $\theta_2$, $\theta_3$, $\theta_4$ and $\theta_5$ at positive angles. At the peak of $\theta_4$ —0th order diffracted light of incident light 90, 91 are diffracted. The peak of $\theta_4$ corresponds to a peak of 1st order diffracted light generated when the pitch of the fringe is equal to the pitch of the grating. The peaks of $\theta_1 - \theta_5$ include position information between the fringe and the grating 25 on the wafer 26.

Each light intensity of the peaks is observed as superimposed diffracted light beam pairs such as (−3, +5), (−2, +4), . . . (+5, −3).

Figure 7:
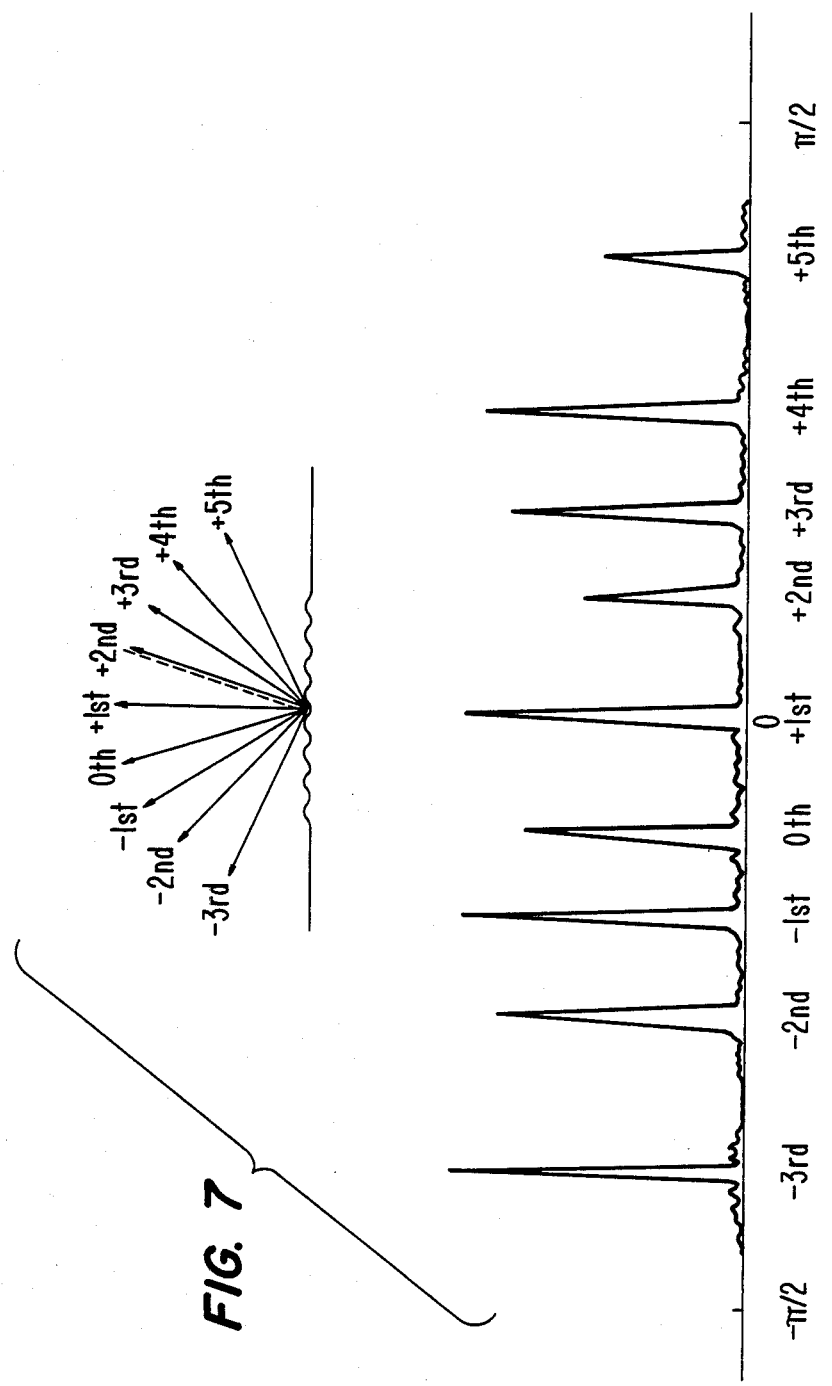
FIG. 7 shows the light intensity of the diffracted light from the gratings on the wafer.

FIG. 7 shows the light intensity of the diffracted light from the grating on the wafer, when one incident beam 90 is applied. Each light intensity of the peaks is varied in accordance with the cross-section shape of the grating. Therefore, by summing up those diffracted light intensities, the cross-section shape of the grating is simulated by equation (11), wherein $$f_{(x)} = \sum_{k=1}^{n} C_k \cos(2k-1) S_0 x \quad (11)$$

wherein $C_K$ is a weighting factor for each diffraction order, K is the diffraction order, $S_O$ is the spatial frequency of the grating, and the pitch P of the grating is then $P=1/s_o$.

In FIG. 5, the diffracted beams of each order go back through the second Fourier transformation lens 22a and then a Fourier spectrum is obtained for each of the diffracted orders at the Fourier transformation plane ξ. Each diffracted order of the spectrum is reflected by a mirror M and is detected by the photo-detector D.

In the same manner, other diffracted beams are obtained for the single incident beam 91 and the cross-section shape of the grating for the incident beam 91 is simulated. From these simulated results, a more precise grating cross-section shape is obtained.

Figure 8:
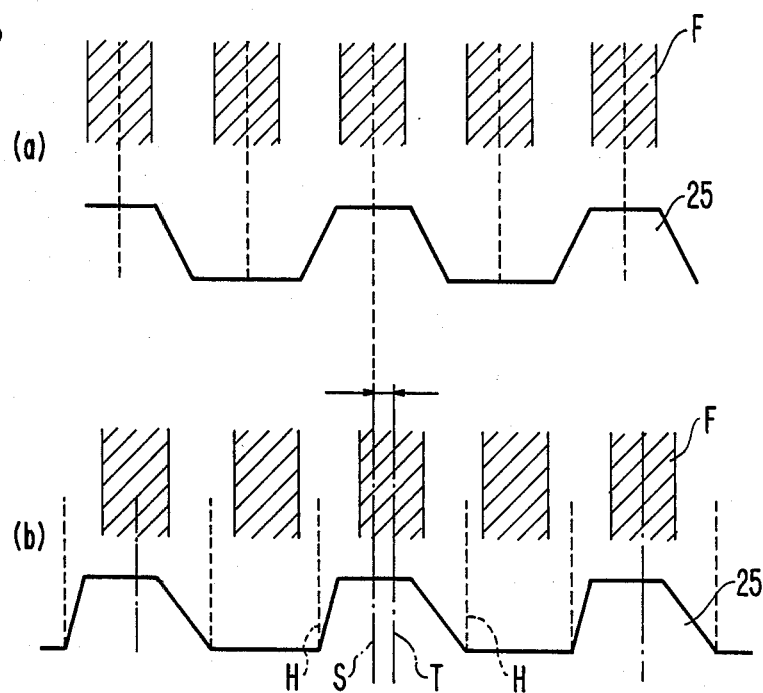
FIGS. 8(a) and 8(b) are illustrations for explaining the alignment.

In FIG. 8 an overlay between the fringe F and the grating 25 is shown. FIG. 8(a) shows the overlay for the symmetrical grating shape and FIG. 8 (b) shows the case for the asymmetrical grating shape. The cross-section shape of the grating is the result of the simulation described above, and the relation between $C_K$ and the shape is correlated by the data base of the grating shapes.

When the grating shape is symmetrical, overlay between the fringe and grating is registered at the center of the grating. But in the case where the grating shape is asymmetrical, overlay between the fringe and grating is displaced at site S from a center T of a designed pattern H. As a result, the overlay displacement is simulated by the this invention, very large overlay displacement occurs. In diffracted light intensity and the overlay displacement is corrected by monitoring the stage movement. The stage movement is precisely detected by an interferometer. The stage is used for supporting the wafer 26.

Supposing that light intensity of each order of diffracted light is $I_0, I_{+1}, I_{+2} \ldots$, the simulation of the configuration or shape of the grating is carried out by comparing the amplitude of each normalized order of diffracted light $I_{+1}/I_0, I_{+2}/I_0 \ldots I_0$. In the case of the simulation, asymmetry of the grating shape is simulated by the comparison of data base generated from the comparison of the light intensity of each order of diffracted light and grating shape, and the value generated from actual detection of the diffracted light. Therefore, diffracted light beams to be detected may be simulated sufficiently by $I_0, I_{+1}$, and $I_{\pm 2}$. By the use of these values, $I_0, I_{\pm 1}$ and $I_{\pm 2}$, a coefficient or weighting factor $C_K$ is obtained so that $f_{(x)}$ is calculated by equation 11.

The input of a compensation value is now explained. In the case where the grating shape is asymmetrical and the alignment of the fringe and the grating is carried out by the diffracted light perpendicular to the wafer 26 (±1st order light beams in FIG. 7), the detector is positioned on S in FIG. 8. In this case, the difference between S and T, which is the center of the bottom portions H-H of the grating grooves, is read out and the compensation value is inputted.

The amplitude of the compensation value is determined by the comparison of the value simulated from the difference of T and S, and the data accumulated in actual processes. The wafer 26 is moved with reference to the compensation value and the alignment with high precision is carried out.

The structure of the spatial filter 28 is now explained with reference to FIG. 9. The spatial filter 28 has a plurality of openings therein and a plurality of photodetectors thereon. A first opening 70 ξ is used for passing −1st order diffracted light beam 42 of the reticle grating 34 therethrough. A photo-detector 71ξ comprises six photo detection elements detecting 0th, ±1st, −2nd, +3rd, +4th order diffracted light beams that the X-direction use grating $25_x$ of the wafer 26 produces by diffracting the diffracted light beams passed through the first opening 70η. 70η designates a first opening relating to Y-direction use grating $25_y$ of wafer 26. 71η designates a photo-detector which comprises five photo-detection elements. Therefore, the first openings comprise 70η and 70η and first photo-detectors comprises 71η and 71η. 70η and 71η are positioned on substantially the same axis, and 70η and 71η are also positioned substantially on another similar axis. A cross angle of 70η and 70η is substantially the same as that of gratings $25_x$ and $25_y$. In the explanation hereinafter, ξ corresponds to the X-direction grating $25_x$ and η corresponds to the Y-direction grating $25_y$.

Second openings 72ξ and 72ξ are used for passing a +1st order diffracted light beam 44 therethrough. Second photo-dectors 73ξ and 73ξ comprise ten photo-detection elements detecting 0th, ±1st, +2nd, −3rd, −4th diffracted light beams that the grating 25 of the wafer produces by diffracting the diffracted light beam passing through the second openings 72ξ and 72ξ.

Third openings $74_{ξ-1}, 74_{ξ-2}, 74_{ξ-1}, 74_{ξ-2}$ are used for passing +1st order diffracted light beams 42 and 44. Third photo-detectors 75ξ and 75ξ comprise eight photo-detection elements detecting each diffracted light beam pair, i.e., (+1st, −1st), (+3rd, +1st), (+4th, +2nd), (−1st, −3rd), and (−2nd, −4th) that the grating of the wafer produces by diffracting +1st diffracted light beams passing through the third openings.

The spatial filter moves by use of the mechanism shown in FIG. 10. The spatial filter is fixed on a rotary stage 80 which is rotatably mounted on a movable stage 82. A pulse motor 84 is disposed on the movable stage 82 for rotating the spatial filter 28 along with the rotary stage 80. The movable stage 82 moved linearly in the directions of arrow 86. A ball screw 100 and pulse motor 102 are used for moving the movable stage 82. The movable stage may be moved by use of a linear motor.

The spatial filter 28 has, as explained above, three kinds of filtering functions and a function for pattern exposure. These functions are now explained.

(1) In the case where only −1st order diffracted light beam 42 passes through the spatial filter (inclusive of −1st order diffracted light beam for Y-direction use), the spatial filter 28 is rotated by the pulse motor 84 in such a manner that the first openins 70η and 70η are located at the positions through which the −1st order diffracted light beam 42 passes, which is produced by the gratings $34_x$ and $34_y$ of the reticle 20. The −1st order diffracted light beam 44 passing through the first openings 70ξ and 70ξ is diffracted by the gratings $25_x$ and $25_y$ of the wafer 26, and the re-diffracted light beams are detected by the first photo-detectors 71η and 71η. By use of outputs from the photo-detectors, the grating shape is simulated as stated above.

(2) In the case where only +1st order diffracted light beam 44 passes through the spatial filter 28 (inclusive of +1st order diffracted light beam for Y-direction use), the spatial filter 28 is rotated by the pulse motor 84 in such a manner that the second openings $72_\xi$ and $72_\xi$ are located at the positions through which the +1st order diffracted light beam passes. The re-diffracted light beams diffracted by the gratings $25_x$ and $25_y$ are detected by the second photo-detectors $73_\xi$ and $73_\eta$ so that the grating shape is simulated.

(3) In the case where only +1st order diffracted light beams pass (inclusive of ±1st order diffracted light beams for Y-direction use), as in case (1), the spatial filter 28 is rotated by the pulse motor 84 in such a manner that the third openings $74_{\xi-1}$, $74_{\xi-2}$, $74_{\xi-1}$, $74_{\eta-2}$ are located at positions through which the ±1st order diffracted light beams 42, 44 pass. The third photo-detectors $75_\xi$ and $75_\xi$ detect re-diffracted light beams diffracted by the grating of the wafer to obtain information concerning the positional relationship between the gratings $34_x$ and $34_y$ of the reticle 20, and the gratings $25_x$ and $25_y$ of the wafer 26.

Further, according to the result of simulation of the grating shape in cases (1) and (2), the amount of error in alignment generated from the grating shape is compared to position information and used for adjustment of compensation of the position so that alignment with higher precision can be accomplished.

The distance to be compensated for the wafer movement can be detected as position information by light intensity detection of the third photo-detectors $75_\xi$ and $75_\xi$ and therefore, can be monitored. Thereby, amount of movement of the wafer 26 can be precisely monitored.

(4) In the case of light exposure of a circuit pattern, etc. on the reticle 20, the spatial filter 28 is removed from the light path of the first Fourier transformation lens 22 by movement of the movable stage 82 by the pulse motor 84 and the circuit pattern is light exposed on the wafer 26.

In the above explanation the grating shape is simulated in case (1) by passage of only the −1st order diffracted light beam and in case (2) by passage of only the +1st order diffracted light beam. It is of course possible to simulate the grating shape by use of either one of the diffracted light beams. The use of both (1) and (2) enables more precise simulation of the grating shape.

In the above embodiment, three types of filtering functions are carried out by the three types of openings, but each of the openings can be used in common. For example, the first opening $70_\xi$ can also be used as the second opening $72_\xi$. In the first embodiment, the first, second and third openings are positioned concentrically with respect to each other, and the spatial filter 28 rotates and moves linearly so that it has three types of filtering functions and a function of pattern light-exposure. As such, the spatial filter can be constructed in a small size and each filtering function can be selected at high speed.

Further, in the first embodiment, the movable stage 82 is moved linearly when pattern light exposure is conducted, but it is of course possible to rotate the movable stage 82 so that it is removed from the light path of the first Fourier transformation lens 22.

FIG. 11 shows another example of a spatial filter 28. In this example, first, second and third openings 70, 72, 74 are positioned in a straight line, rather than concentrically. First, second and third photo-detectors 71, 73, 75 are not positioned concentrically unlike the structure shown in FIG. 9. The spatial filter 28 further includes a fourth opening 103 which is used for pattern light-exposure. That is, suitable openings and photo-detectors are selected by only a straight movement of the movable stage 82.

Figure 12:
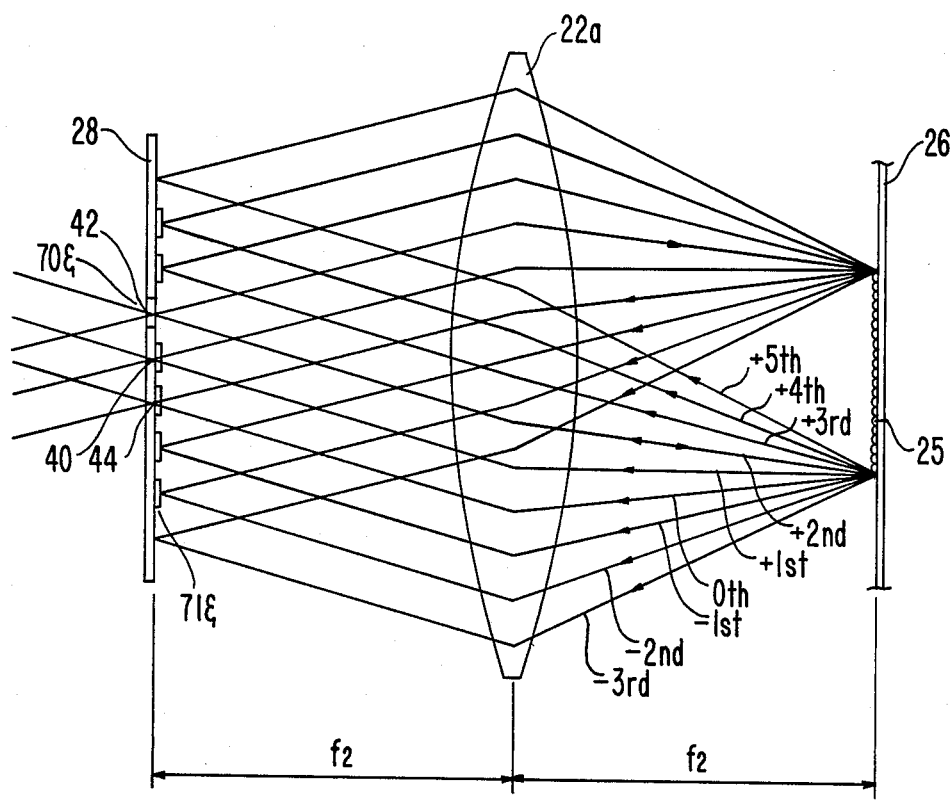
FIG. 12 is an illustration for explaining the principle of the operation of the exposure apparatus.

FIG. 12 shows the structure that the spatial filter 28 having openings and photo-detectors as stated above is located in a Fourier spectral plane. The −1st order diffracted light beam 42 passes through the first opening $70\eta$ and the second Fourier transformation lens $22a$ which a focal distance $f_2$, and is applied on the wafer 26.

Gratings $25_x$ and $25_y$ are provided on the wafer 26 at the positions which correspond to the gratings $34_x$ and $34_y$ of the reticle 20. The −1st order diffracted light beam 42 is diffracted by the grating 25 so that the 0th, +1st, +2nd . . . . order diffracted light beams are produced. Light intensity of each diffracted light beam is detected by a photo-detector $71\eta$.

Figure 14:
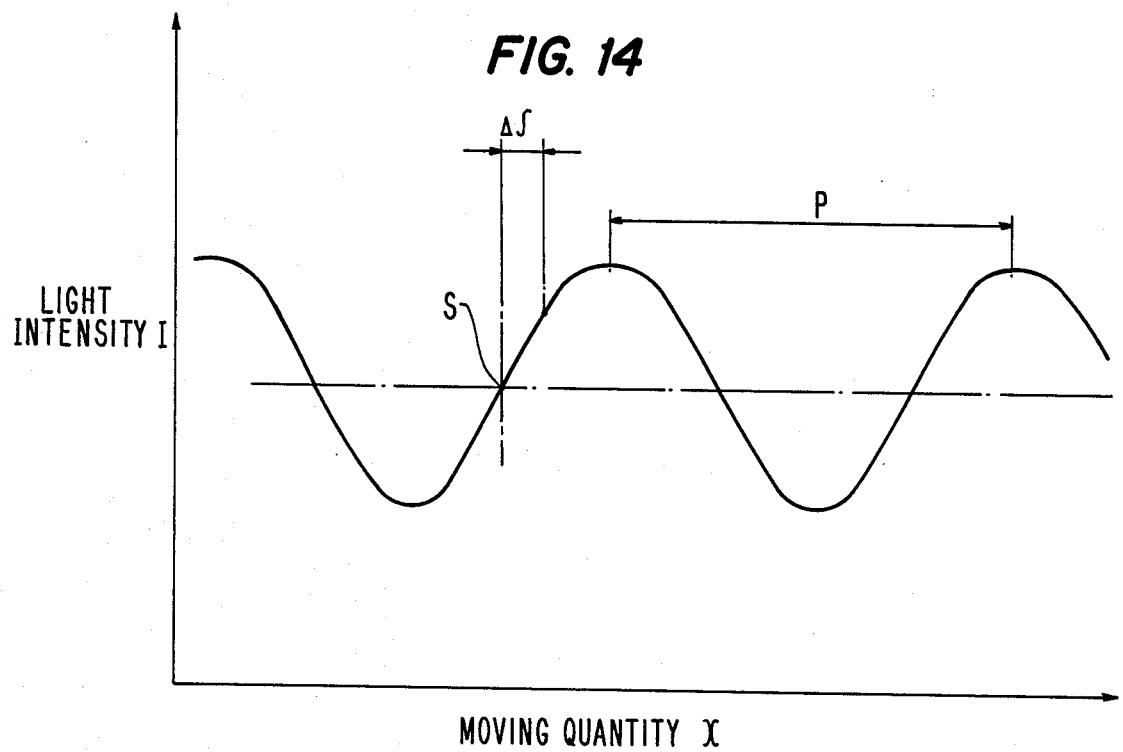
FIG. 14 shows a graph of light intensity I vs. movement quantity X.
Figure 13:
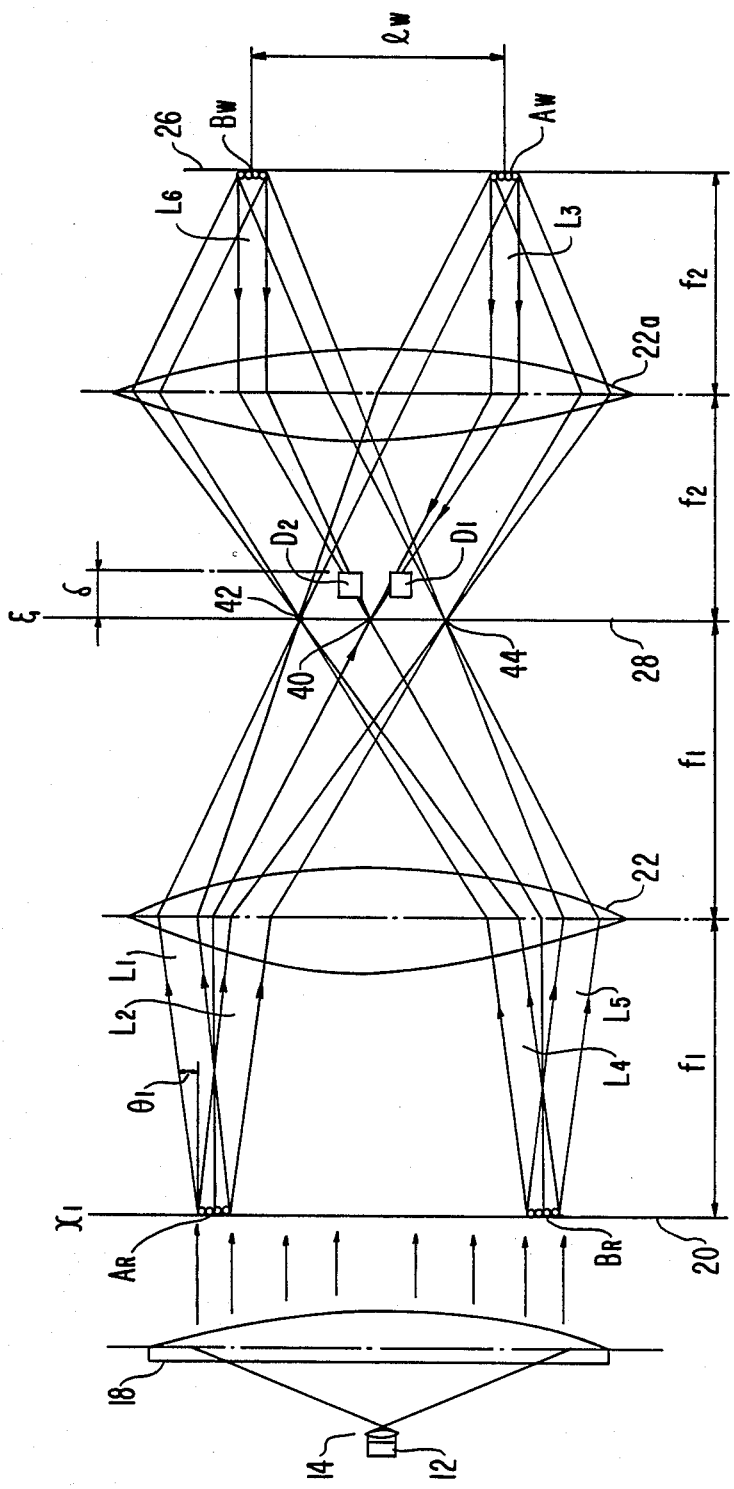
FIG. 13 is an illustration for explaining the principle of operation of another embodiment of the invention.

FIG. 13 shows another embodiment of the invention. The reticle 20 has gratings $A_R$ and $B_R$ with a pitch $P_1$. The spatial filter 28 is located in proximity of the Fourier transformation plane on which the Fourier spectral image is formed. The wafer 26 has gratings $A_W$ and $B_W$ which are spaced from each other by a distance $l_W$. The gratings $A_W$ and $B_W$ are formed at positions which correspond to the gratings $A_R$ and $B_R$. The ±1st order light components from gratings $A_R$ and $B_R$ are interfered with each other so that a fringe pattern is produced. At this time, information is obtained which is representative of the positional relationship of the fringe pattern and the gratings $A_W$ and $B_W$ on the wafer 26. That is, +1st order diffracted light beam $L_1$ and −1st order diffracted light beam $L_2$ produce a fringe pattern on the grating $A_W$. Then, the light intensity of a re-diffracted light beam $L_3$ is detected by a photo-detector $D_1$. By measuring light intensity of diffracted light beams $L_3$ with minute movement of the wafer 26, FIG. 14 is obtained. FIG. 14 shows a variation of light intensity of a sine wave shape and the relation of very high resolution between the fringe pattern due to the grating $A_R$, and the grating $A_W$. Similarly, +1st order diffracted light beam $L_4$ and −1st order diffracted light beam $L_5$ produce a fringe pattern on the grating $B_W$ of the wafer 26. The light intensity of a re-diffracted light beam $L_6$ is detected by a photo-detector $D_2$ so that the positional relationship between the gratings $B_R$ and $B_W$ can be detected precisely.

In this case, since the wafer 26 has received various kinds of thermal treatment processes, the wafer 26 is slightly transformed due to thermal pressure, thermal inflation, etc. Therefore, the distance between the gratings $A_W$ and $B_W$ on the wafer 26 is slightly changed as compared with initial distance, and therefore, it does not completely coincide with a distance $l_R$ between the gratings $A_R$ and $B_R$ on the reticle 20.

That is, if the positional relationship of the gratings $A_R$ and $A_W$ is coincided on a center position S in FIG. 14, the relation of the gratings $B_R$ and $B_W$ is coincided on the center position S unless there is no minute transformation of the wafer 26. But if there is a minute transformation $\Delta S$, the center position S deviates by $\Delta S$. By detecting $\Delta S$, the amount of minute transformation $\Delta S$ of the wafer 26 can be detected precisely.

Figure 15:
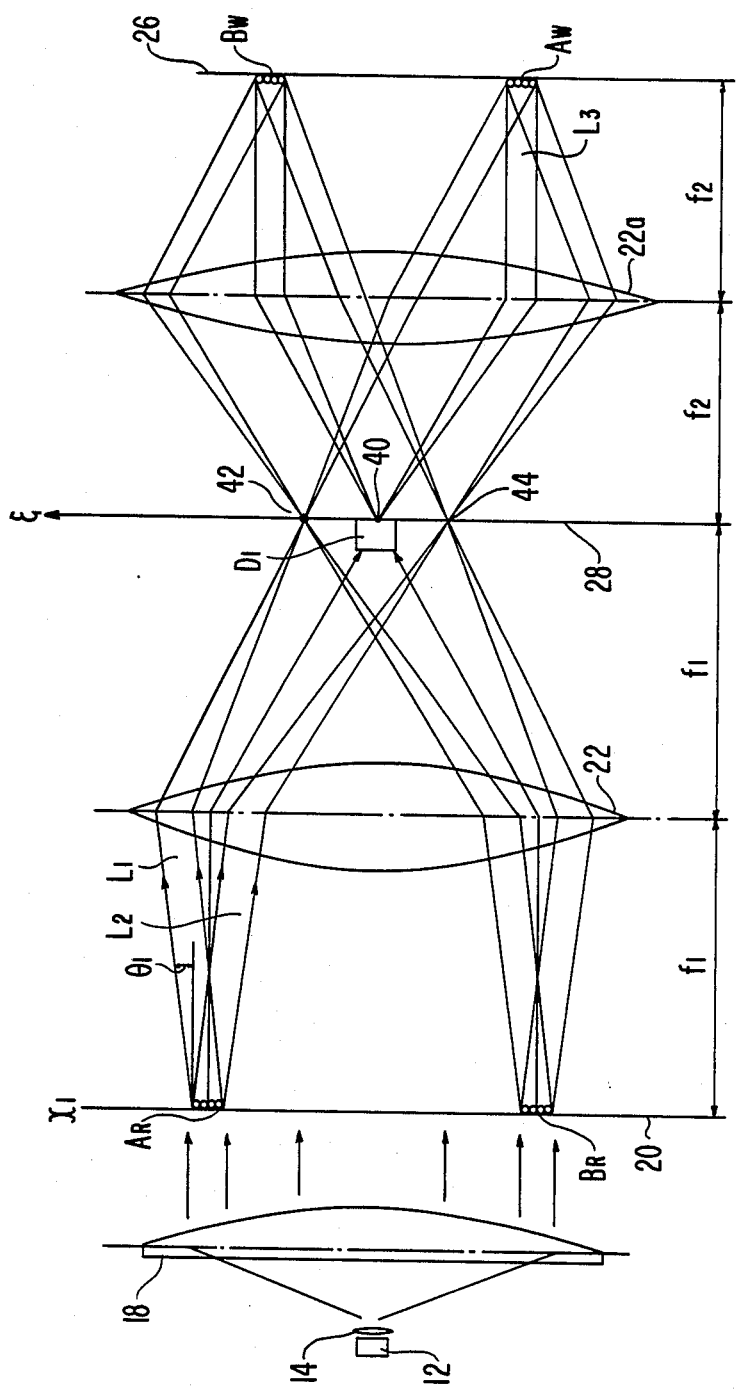
FIG. 15 is an illustration for explaining the principle of operation of still another embodiment of the invention.

FIG. 15 shows still another embodiment of the invention. In this embodiment, there is provided only one photo-detector $D_1$ which is disposed on the spatial filter 28 at the position of a path of the diffracted light beam 40. The photo-detector $D_1$ cuts out the light beams which are to be applied to gratings $A_R$ and $B_R$ on reticle 20 so that it detects the relationship of each grating.

As another example, the wafer 26 or the reticle 20 is moved in such a manner that the center position of a distance $l_R$ between the gratings $A_R$ and $B_R$ on the reticle 20 coincides with the center position of the gratings $A_W$ and $B_W$ on the wafer 26, and thereby, alignment with taking into consideration an amount of minute transformation of the wafer 26 is possible so that more precise alignment is accomplished.

As still another example, when the distance $f_1$ of the reticle 20 and the first Fourier transformation lens 22 is changed, the distance $l_R$ between the gratings $A_R$ and $B_R$ on the reticle 20 changes with respect to the distance between the gratings $A_W$ and $B_W$ on the wafer 26. By use of this, the positional relationship of the reticle 20 and first Fourier transformation lens 22 is adjusted by a minute transformation quantity $\Delta S$ of the wafer 26 so that the distance between the gratings $A_R$ and $B_R$ on the reticle 20 becomes equal to the distance between the gratings $A_W$ and $B_W$ on the wafer 26 and more precise alignment is possible.

In FIG. 13, a light beam from the light source 12 is applied on almost the whole area of the reticle 20. However, even if two light beams are applied on the reticle 20 and the light beams are applied only on the gratings $A_R$ and $B_R$ of the reticle 20, similar advantages may be obtained.

Figure 16:
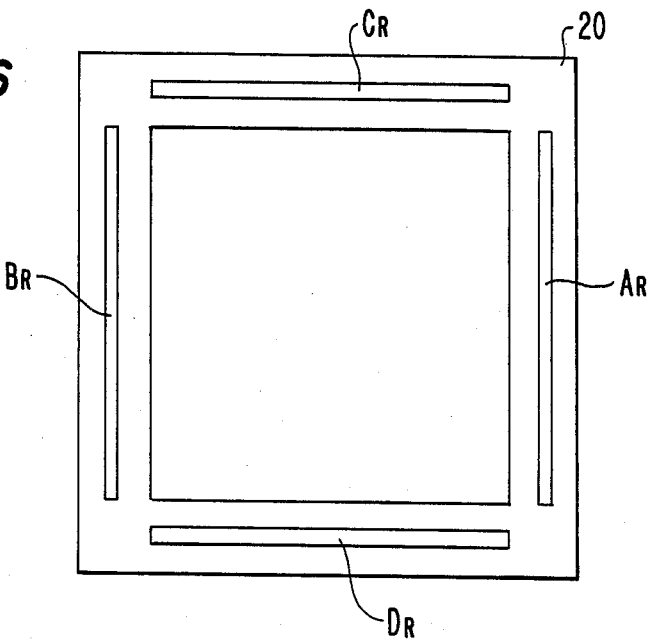
FIG. 16 is a plan view of another example of the reticle.

Further, as shown in FIG. 16, additional gratings $C_R$ and $D_R$ are formed on the reticle 20. the gratings $C_R$ and $D_R$ are positioned perpendicularly to parallel gratings $A_R$ and $B_R$. Also, additional gratings $C_W$ and $D_W$ (not shown), which correspond to the gratings $C_R$ and $D_R$, are formed on the wafer 26.

By use of the same manner as explained in FIG. 13, the positional relationship of each grating on the reticle 20 and each grating on the wafer 26 is detected so that X-Y alignment can be carried out precisely.

Further, by use of a combination of a conventional alignment method with the alignment method of this invention, the precise alignment of the reticle 20 and wafer 26 is possible. That is, by use of a conventional alignment method, rough alignment of less than 0.5 μm is carried out and thereafter, more precise alignment is carried out by use of the alignment method of this invention.

Figure 9:
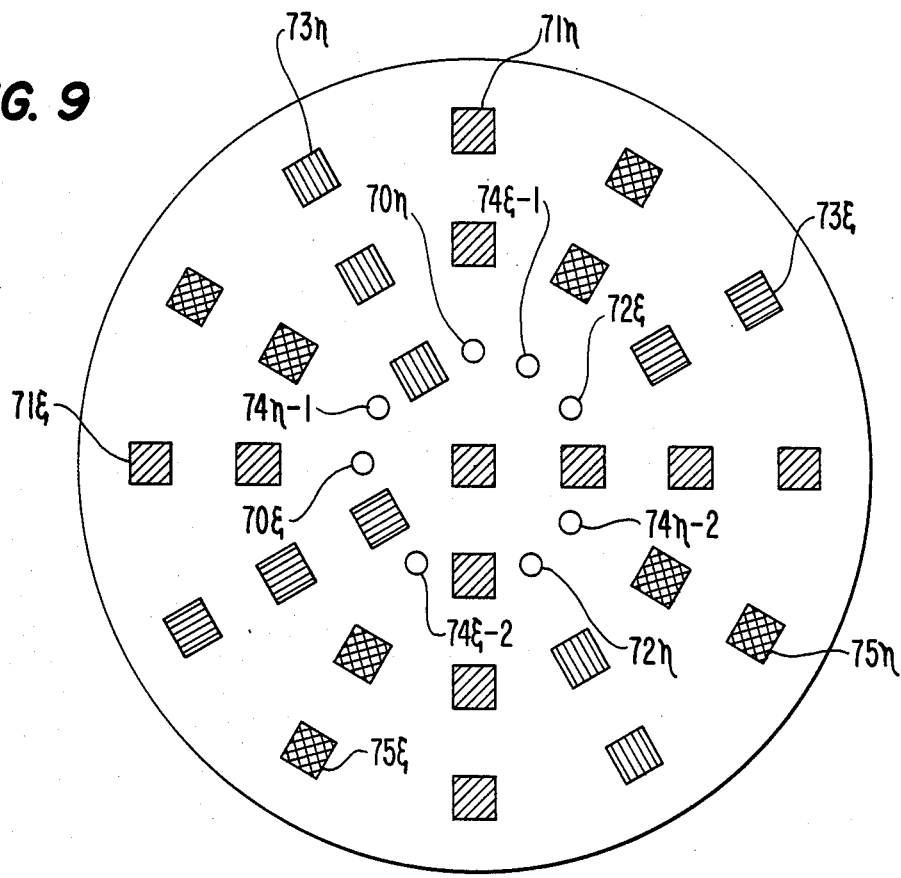
FIG. 9 is a plan view of the spatial filter.

Further, in FIG. 9, a plurality of photo-detectors are disposed on the spatial filter 28, but it is possible to locate the photo-detectors away from the spatial filter 28 by the use of at least one mirror. That is, Fourier spectrums on the spatial filter 28 are reflected by the mirror and then, applied to the photo-detectors located away from the filter 28.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

What we claim is:

1. An exposure apparatus comprising:
  a light source;
  a reticle having a first grating;
  first lens system;
  means comprising a spatial filter disposed around a Fourier spectral plane of the first lens system for blocking at least one order of light and for passing at least three light beams diffracted from said first grating therethrough; second lens system;
  a substrate having a second grating, said first and second lens systems being disposed between said reticle and said substrate;
  a plurality of photo-detectors for detecting light intensities of a plurality of spectrums appearing on said spatial filter; and
  means for processing a plurality of outputs of said photo-detectors so that a pattern shape of said first and second gratings is simulated thereby and the positions of said reticle and said substrate are aligned,
  wherein the light beam generated from the light source is applied to the reticle at which it is divided into a plurality of diffracted light beams by the first grating, and the diffracted light beams are applied through the first lens system, the spatial filter and the second lens system onto said substrate so that said diffracted light beams interfere with each other to form a fringe pattern and are re-diffracted by said second grating, and said re-diffracted light beams appear as a plurality of spectrums on said spatial filter to be detected by said photo-detectors, and the pattern shape of the first and second gratings is simulated by the fringe pattern for alignment of said reticle and said substrate.

2. The exposure apparatus of claim 1, wherein said plurality of photo-detectors is disposed on said spatial filter.

3. The exposure apparatus of claim 1 further comprising at least one mirror for reflecting a plurality of spectrums appearing on said spatial filter, said reflected spectrums being detected by said plurality of photo-detectors.

4. The exposure apparatus of claim 1, wherein said spatial filter includes first openings through each of which passes only a −1st order diffracted light beam from among diffracted light beams diffracted by said first grating, said photo-detectors including first photo-detectors which detect light intensity of a light beam that said second prating produces by diffracting the −1st order diffracted light beams passing through said first openings, second openings through each of which passes only a +1st order diffracted light beam, and said photo-detectors including second photo-detectors which detect light intensity of a light beam that said second grating produces by diffracting the +1st order diffracted light beam passing through said second openings.

5. The exposure apparatus of claim 4, wherein said first and second openings are disposed concentrically with respect to each other.

6. The exposure apparatus of claim 4, wherein said first and second openings are disposed in a straight line.

7. The exposure apparatus of claim 1, wherein said spatial filter includes first openings through each of which passes only one of a −1st order and a +1st order diffracted light beam from among diffracted light beams diffracted by said first grating, said photo-detectors including first photo-detectors which detect light intensity of a light beam that said second grating produces by diffracting the one of the −1st order and +1st order diffracted light beams passing through said first openings, second openings through each of which +1st order diffracted light beams pass, and said photo-detectors including second photo-detectors which detect light intensity of light beams that said second grating produces by diffracting the +1st order diffracted light beams passing through said second openings, and further comprising means for moving said spatial filter in such a manner that said first and second openings are positioned to pass respective diffracted light beams.

8. The exposure apparatus of claim 7, wherein said first and second openings are disposed concentrically with respect to each other.

9. The exposure apparatus of claim 7, wherein said first and second openings are disposed in a straight line.

10. An exposure apparatus comprising:
a light source;
a reticle having a first grating;
first lens system;
means comprising a spatial filter disposed around a Fourier spectral plane of the first lens system for blocking at least one order of light and for passing at least three light beams diffracted from said first grating therethrough; second lens system;
a substrate having second and third gratings, said first and second lens systems being disposed between said reticle and said substrate; and
a plurality of photo-detectors disposed in proximity of said spatial filter for detecting light intensities of diffracted light beams diffracted by said second and third gratings,
wherein the light beam generated from the light source is applied to the reticle at which it is divided into a plurality of diffracted light beams by the first grating, and the diffracted light beams are applied through the first lens system, the spatial filter and the secondn lens system onto said substrate so that said diffracted light beams are interfered with each other to form a fringe pattern and are re-diffracted by said second and third gratings, and light intensities of said re-diffracted light beams are detected by said photo-detectors.

11. The exposure apparatus of claim 10, wherein said reticle has two first gratings , the two first gratings being disposed separately from each other and having patterns simulating patterns of said second and third gratings, respectively.

12. The exposure apparatus of claim 11, wherein at least one of two positions of said substrate and said reticle is adjusted by detecting a relationship of the positions of said two first gratings and the positions of said second and third gratings and by coinciding the center position of said two first gratings with the center position of said second and third gratings.

13. The exposure apparatus of claim 11, wherein the distance between said reticle and said first lens system is adjusted in such a manner that the positional relationship of said two first gratings becomes substantially the same as that of said second and third gratings after the positional relationship of said second and third gratings with respect to said two first gratings has been determined.

14. The exposure apparatus of claim 11, wherein two light beams are applied only on said two first gratings.

15. An exposure apparatus comprising:
a light source;
a reticle having a first grating;
first lens system;
means comprising a spatial filter disposed around a Fourier spectral plane of the first lens system for blocking at least one order of light and for passing at least three light beams diffracted from said first grating therethrough; second lens system;
a substrate having a second grating, said first and second lens systems being disposed between said reticle and said substrate;
a plurality of photo-detectors for detecting light intensities of a plurality of spectrums appearing on said spatial filter; and
means for processing a plurality of outputs of said photo-detectors so that a pattern shape of said first and second gratings is simulated by a fringe pattern generated by interference of two of the diffracted light beams thereby and the position of said reticle and substrate are aligned.

* * * * *